Feb. 26, 1963 E. A. GUTBIER 3,079,482

METHOD OF SOLDERING WIRING ASSEMBLIES

Filed Aug. 12, 1960 2 Sheets-Sheet 1

INVENTOR
E. A. GUTBIER
BY W. A. Johnson
ATTORNEY

Feb. 26, 1963

E. A. GUTBIER 3,079,482

METHOD OF SOLDERING WIRING ASSEMBLIES

Filed Aug. 12, 1960

2 Sheets-Sheet 2

INVENTOR
E. A. GUTBIER
BY W. J. Johnson
ATTORNEY 3,079,482
Patented Feb. 26, 1963

3,079,482

METHOD OF SOLDERING WIRING ASSEMBLIES

Ernst A. Gutbier, Danvers, Mass., assignor to Western Electric Company Incorporated, New York, N.Y., a corporation of New York Filed Aug. 12, 1960, Ser. No. 49,317
3 Claims. (Cl. 219—9.5)

This invention relates to methods of soldering leads, particularly straight leads of electrical components to land areas of wiring boards.

The introduction of a new sandwich type printed wiring design for certain electrical units has brought to light the need of a new mass soldering technique which does not require conventional solder pots. In the new design, each component is held in position in matching cavities which are vertically arranged inside two essentially rectangularly shaped companion blocks. Each block has its wired circuits partially imbedded in its outer surfaces or carries a printed wiring board thereon. The component lead, in each instance, is not bent or clinched against the land area of the wired circuit printed wiring board as is usually the practice in most printed wiring assemblies where the board serves as a component carrier. This new arrangement made possible a new soldering method, the object of which is to more efficiently solder straight leads of electrical components to land areas of wired circuits.

According to the object, the method of soldering straight leads of components to land areas of wired circuits, disposed adjacent apertures in supports for the components and wired circuits through which the straight leads extend, includes placing discs of solder on the land areas and causing them to surround the straight leads after which the discs of solder are softened by heating until they flow on the leads and land areas sufficiently to electrically connect them.

If desired, the solder discs, in the form of washers, may be placed manually concentric with the straight leads on the land areas or the discs, or they may be punched from a ribbon of solder and forced over a straight lead causing perforation of the disc as it is caused to lie on the adjacent land area.

Other objects and advantages will be apparent from the following detailed description when considered in conjunction with the accompanying drawings wherein.

Figure 1:
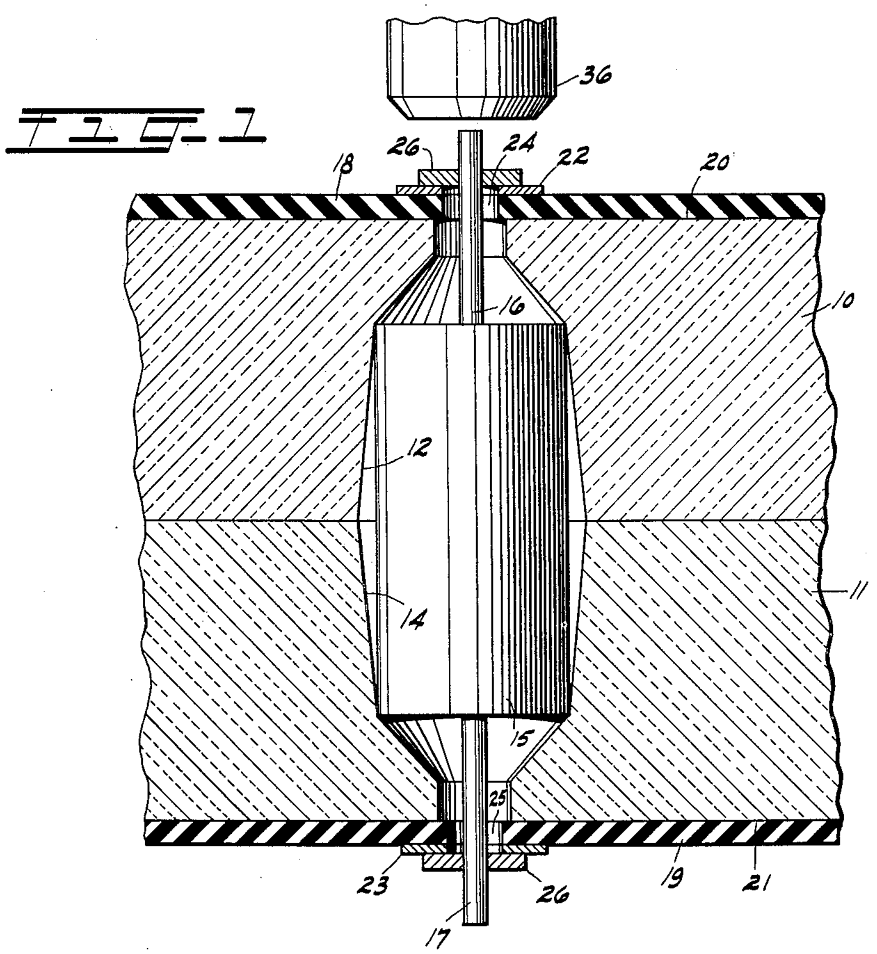
FIG. 1 is a fragmentary vertical sectional view of an electrical unit showing solder discs in place and about to be fused.

In the present illustration, a sandwich type unit is composed of members 10 and 11 with aligned cavities 12 and 14, adapted to receive and hold electrical components 15 having straight leads 16 and 17. Wiring boards 18 and 19 having desired printed circuits disposed on the outer surfaces thereof, are mounted on the outer surfaces 20 and 21 of the members 10 and 11 and are provided with land areas 22 and 23 disposed concentric with apertures 24 and 25 through which the straight leads 16 and 17 extend.

Figure 2:
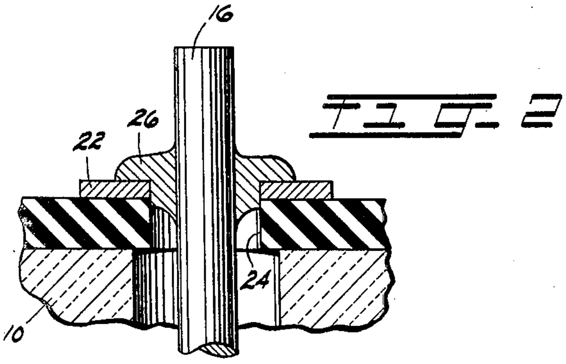
FIG. 2 is a fragmentary detailed sectional view illustrating the connection made between a land area and a straight lead by fusing the solder disc.

The purpose of the method is to provide a suitable mechanical, as well as electrical, bond between the land areas of the wiring boards and the straight leads of the component. This is accomplished broadly by placing a solder disc 26 on the land area concentric with the straight lead of the component and heating the solder disc sufficiently to cause it to flow into the adjacent aperture of the wiring board until it forms the connection shown in FIG. 2. The connection, illustrated in FIG. 2, shows a firm bond between the land area 22 and the straight lead 16 and a firm mechanical connection between the straight lead and the wiring board.

The method may include three main steps: (1) coating the land areas with flux; (2) placing the solder discs on the land areas concentric with the straight leads; and (3) the application of suitable heat to cause the solder discs to flow into the formation illustrated substantially in FIG. 2.

Figure 3:
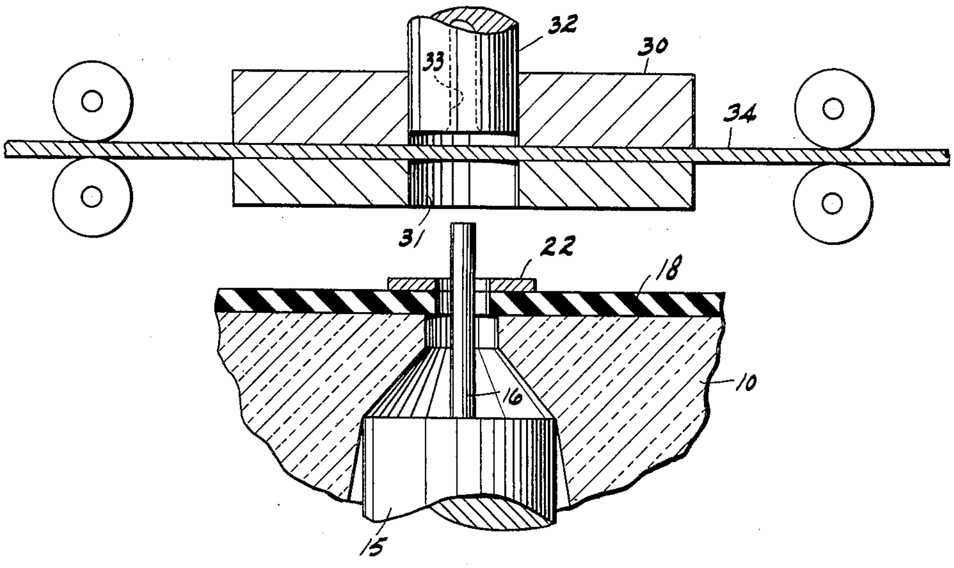
FIG. 3 illustrates the open position of a punch and die structure adapted to punch solder discs from a solder ribbon.
Figure 4:
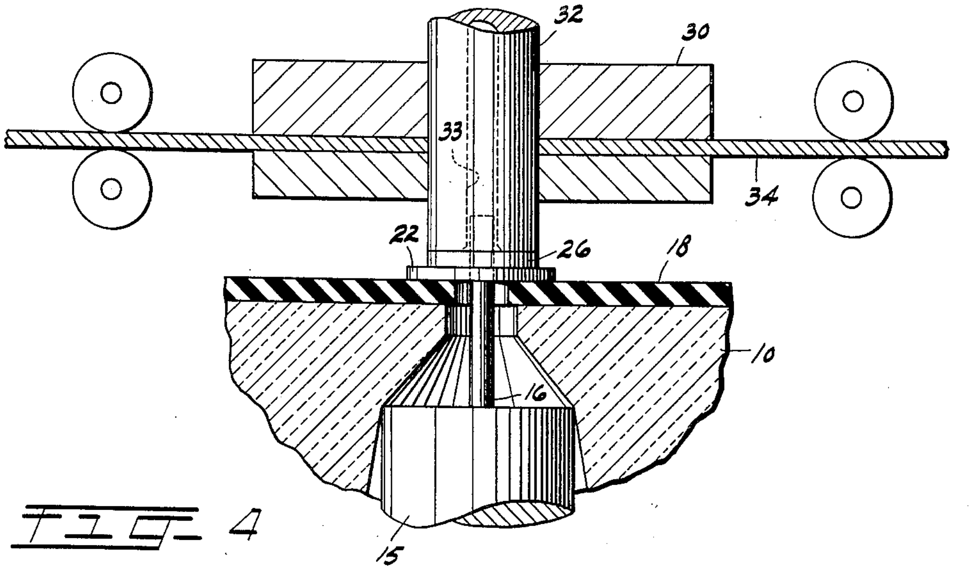
FIG. 4 illustrates the operated position of the structure of FIG. 3 completing the perforation of the solder disc by the straight lead of a component and the location of the perforated disc on the land area.

The second main step may include the manual placing of washer-like solder members 26 on the land areas concentric with the straight leads or the forming of such members, as illustrated in FIGS. 3 and 4. Through the aid of die structure 30, apertured at 31 to receive a reciprocable element 32 serving first as a punch and then as a die through the aid of a central aperture 33, the discs 26 may be punched from a solder ribbon 34. During these steps of the method, each disc is punched from the strip of solder and forced over the end of the straight lead to the land area surrounding the lead, causing the center of the disc to be punctured by the end of the straight lead entering the die aperture 33 so that the punctured portion of the disc will closely hug the lead to assure efficient bonding of the solder to the lead as it is fused through the application of heat. One illustration of heating means for use in the step of fusing the solder disc is an induction coil 36, FIG. 1.

*Steps of the Method*

Broadly, the steps of the method of soldering straight leads of components to land areas of wired circuits disposed adjacent apertures in supports for the components and the wired circuits, through which the straight leads extend, include placing discs of solder concentric with the straight leads and in engagement with the respective land areas and softening the discs of solder by heat until they flow on the leads and land areas sufficiently to electrically connect their leads and land areas. The method includes either placing the discs on the land areas or punching the discs from solder strips forcing them over the ends of the straight leads, puncturing the discs with the leads in such a way that they will hug the leads closely as they lay on the land areas, and heating the discs to cause a flow of the solder from the fused discs about their straight leads and into the apertures of the supports to thereby form straight electrical and mechanical connections between the straight leads, their supports, and particularly, the land areas thereof.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. The method of soldering a straight lead of a component to an apertured land area of a wired circuit disposed on a surface of a wiring board which has an aperture extending through the surface in alignment with the aperture in the land area comprising positioning a component adjacent the wiring board with its straight lead extending through the apertures in the wiring board and the land area, punching a disc from a strip of solder, forcing the disc over the end of its straight lead to cause the lead to centrally puncture the solder disc in such a way that the solder disc will closely hug the lead, and sliding the disc on the lead into engagement with the land area.

2. The method of soldering straight leads according to claim 1 in which the punctured disc is caused to slide with hugging fit on the straight lead until the disc closely engages both the straight lead and the land area, and subsequently fusing the punctured disc to the straight lead and the land area.

3. The method of soldering straight leads according to claim 1 in which the punctured disc is caused to slide with hugging fit on the straight lead until the disc closely engages both the straight lead and the land area, and subsequently inductively heating the solder disc until portions thereof flow over the land area and for a given distance longitudinally of its lead in the apertures of the land area and the wiring board to electrically connect the lead to the land area and support the lead in the aperture of the wiring board.

References Cited in the file of this patent

UNITED STATES PATENTS

| | | |
|---|---|---|
| 1,798,890 | Mayo et al. | Mar. 31, 1931 |
| 2,409,615 | Daniel | Oct. 22, 1946 |
| 2,442,968 | Bierwirth | June 8, 1948 |
| 2,891,138 | Letters | June 16, 1959 |
| 2,926,231 | McDowell | Feb. 23, 1960 |